(12) United States Patent
Araki et al.

(10) Patent No.: US 6,239,402 B1
(45) Date of Patent: May 29, 2001

(54) ALUMINUM NITRIDE-BASED SINTERED BODIES, CORROSION-RESISTANT MEMBERS, METAL-BURIED ARTICLES AND SEMICONDUCTOR-HOLDING APPARATUSES

(75) Inventors: Kiyoshi Araki, Nagoya; Yuji Katsuda, Tsushima; Sadanori Shimura, Iwakura; Tsuneaki Ohashi, Ogaki, all of (JP)

(73) Assignee: NGK Insulators, Ltd. (JP)

( * ) Notice: Subject to any disclaimer, the term of this patent is extended or adjusted under 35 U.S.C. 154(b) by 0 days.

(21) Appl. No.: 09/357,825

(22) Filed: Jul. 21, 1999

(30) Foreign Application Priority Data

Jul. 24, 1998 (JP) .................................................. 10-209452

(51) Int. Cl.$^7$ .................................................. B23K 10/00
(52) U.S. Cl. .................................. 219/121.4; 219/121.43; 219/158; 438/715; 118/725

(58) Field of Search ........................ 219/121.58, 121.43, 219/121.41, 121.4; 438/715, 660; 118/724, 725, 723 I, 723 R; 315/111.21

(56) References Cited

U.S. PATENT DOCUMENTS 5,680,013 * 10/1997 Dornfest et al. ................ 315/111.21
5,788,799 * 8/1998 Steger et al. ........................ 156/345
5,886,863 * 3/1999 Nagasaki et al. .................... 361/234

FOREIGN PATENT DOCUMENTS 5-251365   9/1993 (JP) .
7-273053   10/1995 (JP) .

* cited by examiner

Primary Examiner—Mark Paschall
(74) Attorney, Agent, or Firm—Parkhurst & Wendel, L.L.P

(57) ABSTRACT

An aluminum nitride-based sintered body is disclosed, which includes aluminum nitride as a main ingredient and magnesium and has a polycrystalline structure composed of aluminum nitride crystals.

13 Claims, 10 Drawing Sheets

ALUMINUM NITRIDE-BASED SINTERED BODIES, CORROSION-RESISTANT MEMBERS, METAL-BURIED ARTICLES AND SEMICONDUCTOR-HOLDING APPARATUSES

BACKGROUND OF THE INVENTION (1) Field of the Invention

The present invention relates to aluminum nitride-based sintered bodies, corrosion-resistant members, metal-buried articles and semiconductor-holding apparatuses.

(2) Related Art Statement

With the increase in the memory capacity of the super LSIs, finer processing has come to be necessary, which makes chemical reaction-requiring processes to be more extensively used. Particularly in the semiconductor-producing apparatuses that require a super clean state, halogen-based corrosive gases such as chlorine-based gases or fluorine-based gases are used as deposition gases, etching gases or cleaning gases.

After the deposition, a semiconductor-cleaning gas composed of a halogen-based corrosive gas such as $ClF_3$, $NF_3$, $CF_4$, HF or HCl is used in a heating apparatus in which an objected is to be heated while being contacted with the corrosive gas, for example, in the semiconductor-producing apparatus such as a hot CVD apparatus. Further, a halogen-based corrosive gas such as $WF_6$ or $SiH_2Cl_2$ is used as a film-forming gas in the deposition state.

NGK Insulators, Ltd. disclosed in JP-A-5-251,365 that aluminum nitride sintered bodies each having a layer of aluminum fluoride on the surface exhibit high corrosion resistance against a plasma of the above halogen-based corrosive gas. That is, even when the aluminum nitride sintered body was exposed to, for example, ClF3 gas for one hour, its surface state did not change.

Further, NGK Insulators, Ltd. disclosed in JP-A 5-251, 365 that a film of aluminum fluoride is formed on a surface of an aluminum nitride sintered body by a gas phase method such as CVD. JP-A 7-273,053 discloses that in order to prevent the corrosion of the surface of an electrostatic chuck for semiconductor wafers, the surface of the electrostatic chuck is preliminarily replaced by fluorine to produce $AlF_3$ at the surface of the chuck.

However, the above techniques regarding the aluminum nitride-based sintered bodies are all aimed at the formation of the corrosion-resistant surface layers, and their producing processes are complicated.

SUMMARY OF THE INVENTION

It is an object of the present invention to further improve the corrosion resistance of the aluminum nitride-based sintered body, particularly its corrosion resistance against plasma of a halogen-based corrosive gas.

The present invention relates to an aluminum nitride-based sintered body comprising aluminum nitride as a main ingredient and magnesium and having a polycrystalline structure composed of aluminum nitride crystals.

Further, the present invention relates to a corrosion-resistant member composed at least partially of the above aluminum nitride-based sintered body.

Furthermore, the present invention relates to a metal-buried article comprising a corrosion-resistant member, and a metallic member buried in the corrosion-resistant member, wherein at least a part of the corrosion-resistant member is made of the above aluminum nitride-based sintered body.

Moreover, the present invention relates to a semiconductor-holding apparatus comprising a susceptor having a corrosion-resistive face to be exposed to a halogen-based gas plasma and a rear face, and a heat-insulating portion provided at the rear surface of the susceptor and adapted to limit a heat flow from the susceptor, wherein at least a part of the heat-insulating portion is made of the above aluminum nitride-based sintered .

These and other objects, features and advantages of the invention will be appreciated upon reading of the following description of the invention when taken in conjunction with the attached drawings, with the understanding that some modifications, variations and changes of the same could be easily made by the skilled person in the art to which the invention pertains.

BRIEF DESCRIPTION OF THE INVENTION

For a better understanding of the invention, reference is made to the attached drawings, wherein:

FIGS. 1(a), 1(b) and 1(c) are sectional views showing corrosion-resistant members according to the present invention, respectively:

DETAILED DESCRIPTION OF THE INVENTION

Figure 1A:
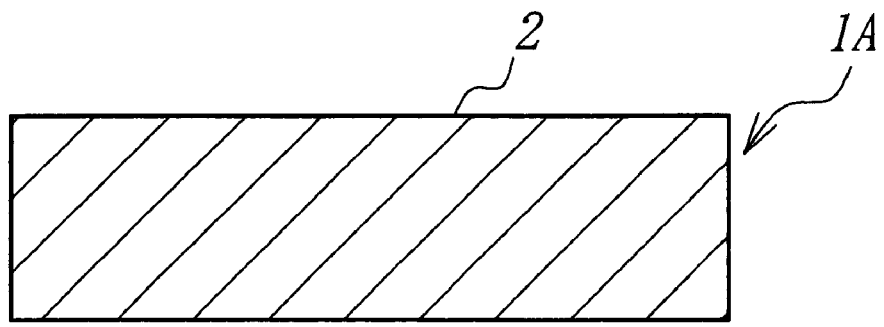

The present inventors discovered that the incorporation of magnesium into the aluminum nitride sintered bodies extremely improves corrosion resistance of the sintered bodies themselves, particularly their corrosion resistance against a halogen-based corrosive gas. The inventors reached the present invention based on this discovery.

The content of aluminum in the sintered body according to the present invention needs to be such a level that particles of aluminum nitride are present as the main phase, and the content of aluminum is preferably not less than 30 wt %.

If magnesium is incorporated in an amount of not less than 0.1 wt %, further not less than 0.5 wt % as calculated in the form of its oxide, the corrosion resistance of the sintered body is particularly conspicuously improved. If magnesium is not less than 0.5 wt %, the resistance of the sintered body is conspicuously increased. The aluminum nitride-based sintered body having such a high resistance is suitable particularly for a heater, an electrostatic chuck, a susceptor or the like which is to be used in an environment exposed to a halogen-based gas plasma, for example. For example, the sintered body can exhibit high corrosion resistance and also prevent leakage of current.

The content of magnesium in the aluminum nitride-based sintered body is not limited. However, it is preferable that the magnesium content is not more than 30 wt % as calculated in the form of its oxide from the standpoint of production. If the content of magnesium increases, the coefficient of thermal expansion of the sintered body rises. Therefore, in order to approach the coefficient of thermal expansion of the aluminum nitride-based sintered body according to the present invention to that of an aluminum nitride-based sintered body containing no magnesium, the content of magnesium in the sintered body according to the present invention is preferably not more than 20 wt %.

The aluminum nitride-based sintered body according to the present invention exhibited high corrosion resistance against the halogen-based corrosive gas plasma, particularly a halogen gas plasma including a chlorine plasma and a fluorine plasma.

Further, the inventors discovered that the heat conductivity of the aluminum nitride-based sintered body is conspicuously decreased by increasing the content of the magnesium in the sintered body to not less than 1 wt %, further to not less than 5 wt %. Such a sintered body is suitable particularly for use requiring the heat-insulating effect. The reason why the coefficient of thermal conductivity is lowered is considered that magnesium oxide enters the AlN lattice to increase scattering of phonons.

As to the constituting phase of the sintered body, there are two cases: one case in which the constituting phase of the sintered body is made of a single phase of aluminum nitride, and the other in which the constituting phase has a magnesium oxide phase precipitated. Since the coefficient of thermal expansion of the sintered body is near to that of the aluminum nitride containing no magnesium in the case that the constituting phase is the single aluminum nitride phase, thermal stress is mitigated, and the magnesium oxide phase does not function as a starting point of breakage, if the sintered body is integrated with a conventional aluminum nitride sintered body.

On the other hand, when the magnesium oxide phase is precipitated, the corrosion resistance is further improved. Generally speaking, in a case where a second phase is dispersed in an insulating body, the resistivity of the entire sintered body decreases if the resistivity of the second phase is lower. However, as to a case where the constituting phase of the sintered body is made of AlN+MgO, the problem that the volume resistivity entirely decreases does not occur because MgO has high volume resistivity.

Since the addition of MgO interrupts the sintering of AlN (Yogyo-Kyokaishi No. 89, Vol. 6, 1981, pp 330–336), hot press sintering or hot isostatic press sintering is preferred in producing the sintered body according to the present invention.

If the sintered body according to the present invention is integrated with an aluminum nitride sintered body containing no magnesium in producing a semiconductor, the content of metallic impurities in this aluminum nitride sintered body is preferably not more than 1000 ppm.

If a metallic member is to be buried in a corrosion-resistant member involving the sintered body according to the present invention, it is preferably that the metallic member is buried inside a non-fired body for the sintered body, and the resulting non-fired body is hot press sintered under pressure of 50 kgf/cm$^2$ or more.

Sintered bodies of the present invention were produced as below, and their various properties were evaluated.

A raw powder of aluminum nitride and a magnesium source were mixed according to each of Examples and Comparative Examples in Tables 1 to 5. The AlN powder was reduction nitridation powder or direct nitridation powder, and the magnesium source was magnesium oxide, $Mg(NO_3)_2$, $MgCl_2$ or $MgSO_4$. If necessary, other additive or additives ($Y_2O_3$, C, Li) was or were measured. Thereafter, the mixture was mixed in a pot mill with use of isopropyl alcohol as a solvent, which was dried, thereby obtaining mixed powders shown in Tables. In Examples 45 to 48, lithium nitrate, which was used as a starting material of Li, was measured to give 0.1 or 0.3 wt % as calculated in the form of an oxide thereof, and served for the preparation.

Each mixed powder was uniaxially molded under a pressure of 200 kgf/cm$^2$, thereby preparing a discoidal molded body having a diameter of 100 mm. This molded body was placed in a graphite mold, which was hot press sintered in an nitrogen atmosphere. The maximum temperature in sintering was set at 1700 to 2000° C., and the molded body was held at the maximum temperature for 4 hours in each case. The resulting sintered body was evaluated as follows.

(Content of metallic impurities)

The content of metallic impurities was measured by an ICP (Induction Coupled Plasma) analysis.

(High temperature volume resistivity)

The volume resistivity of the insulating body was measured in vacuum according to JIS 2141.

(Appearance)

Appearance was visually evaluated.

(Thermal conductivity)

The thermal conductivity was measured by a laser flush method.

(Bulk density)

The bulk density was measured by Archimedes method with pure water as a medium.

(CTE)

The average coefficient of thermal expansion of the sintered body in a temperature range of room temperature to 800° C. was measured in nitrogen, while it was heated at 5° C./min.

(Constituting phase)

The constituting phase was confirmed by XRD. 2θ=20–80 degrees (Etching rate)

The sintered body was placed in a chamber kept at 735° C. While the inner pressure of the chamber was kept at 0.1 torr in the state that 300 sccm of $Cl_2$ gas and 100 sccm of $N_2$ gas were flown through the chamber, an electric power of 800 W was applied to generate a high frequency plasma of a ICP system. After being exposed to the plasma for 2 hours, the etching rate was deternined based on a change in weight.

TABLE 1(a)

| No. | | AlN powder | Firing temperature | Mg source | Mg aid amount (calculated in the form of oxide) | Additive other than Mg | Amount of metallic impurities other than Mg (ppm) |
|---|---|---|---|---|---|---|---|
| 1 | Comparative Example | reduced nitridized powder | 1800° C. | — | 0.0 wt % | C: 0.05 wt % | 50 |
| 2 | Comparative Example | reduced nitridized powder | 1900° C. | — | 0.0 wt % | — | 40 |
| 3 | Comparative Example | reduced nitridized powder | 1900° C. | — | 0.0 wt % | $Y_2O_3$: 0.1 wt % | 680 |
| 4 | Comparative Example | reduced nitridized powder | 1800° C. | — | 0.0 wt % | $Y_2O_3$: 3.5 wt % | 38200 |
| 5 | Example | reduced nitridized powder | 1700° C. | MgO | 0.1 wt % | — | 30 |
| 6 | Example | reduced nitridized powder | 1700° C. | MgO | 0.3 wt % | — | 60 |
| 7 | Example | reduced nitridized powder | 1700° C. | MgO | 1.0 wt % | — | 70 |
| 8 | Example | reduced nitridized powder | 1700° C. | MgO | 5.0 wt % | — | 70 |
| 9 | Example | reduced nitridized powder | 1700° C. | MgO | 10 wt % | — | 50 |

TABLE 1(b)

| No. | High temperature resistivity * Ω · cm 600° C. | High temperature resistivity * Ω · cm 700° C. | Appearance (color) | Thermal conductivity W/m · K | Bulk density g/cc | CTE (800° C.) ppm | Constituting phase (XRD) | Etching rate μm/hr |
|---|---|---|---|---|---|---|---|---|
| 1 | 1.5E + 07 | — | black | 88 | 3.26 | 5.4 | AlN | 4.5 |
| 2 | — | — | amber | 81 | 3.27 | 5.2 | AlN | 4.8 |
| 3 | — | — | amber | 90 | 3.27 | 5.3 | AlN | 5.3 |
| 4 | 1.2E + 08 | — | amber | 197 | 3.32 | 5.4 | AlN + YAG + YAM | 8.8 |
| 5 | 6.6E + 07 | — | whitish gray | 78 | 3.20 | 5.2 | AlN | 3.6 |
| 6 | 2.6E + 08 | 2.7E + 07 | whitish gray | 76 | 3.09 | 5.4 | AlN | 3.7 |
| 7 | 5.4E + 09 | 8.8E + 07 | whitish gray | 72 | 3.15 | 5.5 | AlN + MgO | 3.3 |
| 8 | 3.8E + 09 | 6.3E + 07 | gray | 63 | 3.26 | 5.8 | AlN + MgO | 2.4 |
| 9 | 2.2E + 09 | 4.0E + 07 | gray | 56 | 3.27 | 5.9 | AlN + MgO | 1.7 |

* "—" means that measurement was impossible (<1E + 7 Ω · cm).

TABLE 2(a)

| No. | | AlN powder | Firing temperature | Mg source | Mg aid amount (calculated in the form of oxide) | Additive other than Mg | Amount of metallic impurities other than Mg (ppm) |
|---|---|---|---|---|---|---|---|
| 10 | Example | reduced nitridized powder | 1800° C. | MgO | 0.1 wt % | — | 60 |
| 11 | Example | reduced nitridized powder | 1800° C. | MgO | 0.3 wt % | — | 90 |
| 12 | Example | reduced nitridized powder | 1800° C. | MgO | 1.0 wt % | — | 80 |
| 13 | Example | reduced nitridized powder | 1800° C. | MgO | 5.0 wt % | — | 60 |
| 14 | Example | reduced nitridized powder | 1800° C. | MgO | 10 wt % | — | 80 |
| 15 | Example | reduced nitridized powder | 1900° C. | MgO | 0.1 wt % | — | 70 |
| 16 | Example | reduced nitridized powder | 1900° C. | MgO | 0.3 wt % | — | 90 |
| 17 | Example | reduced nitridized powder | 1900° C. | MgO | 1.0 wt % | — | 80 |
| 18 | Example | reduced nitridized powder | 1900° C. | MgO | 5.0 wt % | — | 60 |
| 19 | Example | reduced nitridized powder | 1900° C. | MgO | 10 wt % | — | 100 |

TABLE 2(b)

| No. | High temperature resistivity * Ω · cm 600° C. | High temperature resistivity * Ω · cm 700° C. | Appearance (color) | Thermal conductivity W/m · K | Bulk density g/cc | CTE (800° C.) ppm | Constituting phase (XRD) | Etching rate μm/hr |
|---|---|---|---|---|---|---|---|---|
| 10 | — | — | dark gray | 80 | 3.26 | 5.3 | AlN | 3.9 |
| 11 | 8.2E + 08 | — | dark gray | 78 | 3.26 | 5.3 | AlN | 3.4 |
| 12 | 1.1E + 12 | 9.3E + 08 | dark gray | 71 | 3.26 | 5.4 | AlN + MgO | 2.7 |
| 13 | 6.1E + 09 | 8.2E + 07 | dark gray | 47 | 3.27 | 5.8 | AlN + MgO | 1.9 |
| 14 | 8.3E + 09 | 5.5E + 07 | dark gray | 36 | 3.27 | 5.9 | AlN + MgO | 1.5 |
| 15 | — | — | patterned | 80 | 3.26 | 5.2 | AlN | 2.9 |
| 16 | 8.5E + 09 | 3.4E + 07 | patterned | 76 | 3.26 | 5.3 | AlN | 2.6 |
| 17 | 1.3E + 11 | 2.0E + 08 | gray | 64 | 3.26 | 5.5 | AlN | 2.2 |
| 18 | 1.2E + 10 | 6.2E + 07 | gray | 32 | 3.26 | 5.8 | AlN | 1.6 |
| 19 | 2.0E + 10 | 7.5E + 07 | gray | 25 | 3.26 | 6.0 | AlN + MgO | 1.2 |

* "—" means that measurement was impossible (<1E + 7 Ω · cm).

TABLE 3(a)

| No. | | AlN powder | Firing temperature | Mg source | Mg aid amount (calculated in the form of oxide) | Additive other than Mg | Amount of metallic impurities other than Mg (ppm) |
|---|---|---|---|---|---|---|---|
| 20 | Example | reduced nitridized powder | 2000° C. | MgO | 0.1 wt % | — | 80 |
| 21 | Example | reduced nitridized powder | 2000° C. | MgO | 0.3 wt % | — | 60 |
| 22 | Example | reduced nitridized powder | 2000° C. | MgO | 1 0 wt % | — | 80 |
| 23 | Example | reduced nitridized powder | 2000° C. | MgO | 5.0 wt % | — | 90 |
| 24 | Example | reduced nitridized powder | 2000° C. | MgO | 10 wt % | — | 110 |
| 25 | Example | directly nitridized powder | 1700° C. | MgO | 0.1 wt % | — | 330 |
| 26 | Example | directly nitridized powder | 1700° C. | MgO | 0.3 wt % | — | 320 |
| 27 | Example | directly nitridized powder | 1700° C. | MgO | 1.0 wt % | — | 300 |
| 28 | Example | directly nitridized powder | 1700° C. | MgO | 10 wt % | — | 380 |

TABLE 3(b)

| No. | High temperature resistivity * Ω · cm 600° C. | High temperature resistivity * Ω · cm 700° C. | Appearance (color) | Thermal conductivity W/m · K | Bulk density g/cc | CTE (800° C.) ppm | Constituting phase (XRD) | Etching rate μm/hr |
|---|---|---|---|---|---|---|---|---|
| 20 | — | — | patterned | 76 | 3.25 | 5.2 | AlN | 2.4 |
| 21 | 1.1E + 08 | — | patterned | 68 | 3.26 | 5.3 | AlN | 2.1 |
| 22 | 1.2E + 10 | 9.4E + 07 | transparent gray | 41 | 3.26 | 5.5 | AlN | 1.9 |
| 23 | 8.5E + 09 | 6.7E + 07 | transparent gray | 26 | 3.25 | 5.9 | AlN | 1.3 |
| 24 | 3.1E + 09 | 4.6E + 07 | transparent gray | 21 | 3.25 | 6.1 | AlN + MgO | 0.9 |
| 25 | 1.3E + 08 | 1.3E + 07 | whitish gray | 80 | 3.16 | 5.3 | MN | 3.9 |
| 26 | 7.3E + 08 | 1.6E + 07 | whitish gray | 78 | 3.04 | 5.4 | AlN | 3.7 |
| 27 | 2.6E + 09 | 2.2E + 08 | whitish gray | 67 | 3.13 | 5.6 | AlN + MgO | 3.8 |
| 28 | 3.8E + 08 | 2.4E + 07 | gray | 56 | 3.28 | 5.8 | AlN + MgO | 2.0 |

* "—" means that measurement was impossible (<1E + 7 Ω · cm).

TABLE 4(a)

| No. | | AlN powder | Firing temperature | Mg source | Mg aid amount (calculated in the form of oxide) | Additive other than Mg | Amount of metallic impurities other than Mg (ppm) |
|---|---|---|---|---|---|---|---|
| 29 | Example | directly nitridized powder | 1800° C. | MgO | 0.1 wt % | — | 290 |
| 30 | Example | directly nitridized powder | 1800° C. | MgO | 0.3 wt % | — | 310 |
| 31 | Example | directly nitridized powder | 1800° C. | MgO | 1.0 wt % | — | 350 |
| 32 | Example | directly nitridized powder | 1800° C. | MgO | 10 wt % | — | 390 |
| 33 | Example | directly nitridized powder | 1900° C. | MgO | 0.1 wt % | — | 330 |
| 34 | Example | directly nitridized powder | 1900° C. | MgO | 0.3 wt % | — | 310 |
| 35 | Example | directly nitridized powder | 1900° C. | MgO | 1.0 wt % | — | 290 |
| 36 | Example | directly nitridized powder | 1900° C. | MgO | 10 wt % | — | 370 |

TABLE 4(b)

| No. | High temperature resistivity * Ω · cm 600° C. | High temperature resistivity * Ω · cm 700° C. | Appearance (color) | Thermal conductivity W/m · K | Bulk density g/cc | CTE (800° C.) ppm | Constituting phase (XRD) | Etching rate μm/hr |
|---|---|---|---|---|---|---|---|---|
| 29 | 2.5E + 07 | — | gray | 79 | 3.27 | 5.2 | AlN | 3.9 |
| 30 | 5.1E + 08 | 1.6E + 07 | gray | 72 | 3.27 | 5.3 | AlN | 3.6 |
| 31 | 1.4E + 10 | 3.6E + 08 | gray | 59 | 3.27 | 5.2 | AlN + MgO | 2.9 |
| 32 | 2.3E + 09 | 7.6E + 07 | gray | 33 | 3.28 | 5.9 | AlN + MgO | 1.7 |
| 33 | 3.5E + 07 | — | gray | 74 | 3.27 | 5.1 | MN | 3.1 |
| 34 | 2.1E + 09 | 3.6E + 07 | gray | 67 | 3.27 | 5.4 | AlN | 2.8 |
| 35 | 2.2E + 10 | 2.3E + 08 | gray | 43 | 3.26 | 5.3 | AlN | 2.3 |
| 36 | 8.8E + 09 | 1.8E + 08 | gray | 22 | 3.27 | 6.0 | AlN + MgO | 1.3 |

* "—" means that measurement was impossible (<1E + 7 Ω · cm).

TABLE 5(a)

| No. | | AlN powder | Firing temperature | Mg source | Mg aid amount (calculated in the form of oxide) | Additive other than Mg | Amount of metallic impurities other than Mg (ppm) |
|---|---|---|---|---|---|---|---|
| 37 | Example | directly nitridized powder | 2000° C. | MgO | 0.1 wt % | — | 290 |
| 38 | Example | directly nitridized powder | 2000° C. | MgO | 0.3 wt % | — | 270 |
| 39 | Example | directly nitridized powder | 2000° C. | MgO | 1.0 wt % | — | 370 |
| 40 | Example | directly nitridized powder | 2000° C. | MgO | 10 wt % | — | 360 |
| 41 (= 17) | Example | reduced nitridized powder | 1900° C. | MgO | 1.0 wt % | — | 80 |
| 42 | Example | reduced nitridized powder | 1900° C. | $Mg(NO_3)_2$ | 1.0 wt % | — | 90 |
| 43 | Example | reduced nitridized powder | 1900° C. | $MgCl_2$ | 1.0 wt % | — | 180 |
| 44 | Example | reduced nitridized powder | 1900° C. | $MgSO_4$ | 1.0 wt % | — | 210 |
| 45 | Example | reduced nitridized powder | 1900° C. | MgO | 0.3 wt % | $Li_2O$: 0.1 wt % | 280 |
| 46 | Example | reduced nitridized powder | 1900° C. | MgO | 0.3 wt % | $Li_2O$: 0.3 wt % | 520 |
| 47 | Example | reduced nitridized powder | 1900° C. | MgO | 1.0 wt % | $Li_2O$: 0.1 wt % | 290 |
| 48 | Example | reduced nitridized powder | 1900° C. | MgO | 1.0 wt % | $Li_2O$: 0.3 wt % | 580 |

TABLE 5(b)

| No. | High temperature resistivity * Ω · cm 600° C. | High temperature resistivity * Ω · cm 700° C. | Appearance (color) | Thermal conductivity W/m · K | Bulk density g/cc | CTE (800° C.) ppm | Constituting phase (XRD) | Etching rate μm/hr |
|---|---|---|---|---|---|---|---|---|
| 37 | — | — | transparent gray | 73 | 3.27 | 5.3 | AlN | 2.7 |
| 38 | 7.2E + 08 | 1.8E + 07 | transparent gray | 61 | 3.27 | 5.2 | AlN | 2.3 |
| 39 | 1.1E + 10 | 1.2E + 08 | transparent gray | 39 | 3.27 | 5.5 | AlN | 1.9 |
| 40 | 3.4E + 09 | 1.1E + 08 | whitish gray | 22 | 3.26 | 5.9 | AlN + MgO | 1.0 |
| 41 (= 17) | 1.3E + 11 | 2.0E + 08 | gray | 64 | 3.26 | 5.4 | AlN | 2.2 |
| 42 | 5.3E + 11 | 3.6E + 08 | gray | 58 | 3.26 | 5.3 | AlN | 1.9 |
| 43 | 8.7E + 10 | 7.3E + 07 | gray | 65 | 3.26 | 5.5 | AlN | 2.3 |
| 44 | 1.5E + 11 | 1.3E + 08 | gray | 59 | 3.26 | 5.4 | AlN | 2.6 |
| 45 | 1.2E + 09 | 6.3E + 07 | gray | 75 | 3.26 | 5.3 | AlN | 2.5 |
| 46 | 9.5E + 09 | 8.1E + 07 | grayish black | 68 | 3.25 | 5.2 | AlN | 2.1 |
| 47 | 7.4E + 10 | 1.5E + 08 | gray | 59 | 3.26 | 5.4 | AlN | 1.9 |
| 48 | 1.1E + 11 | 1.7E + 08 | grayish black | 48 | 3.26 | 5.3 | AlN | 1.6 |

* "—" means that measurement was impossible (<1E + 7 Ω · cm).

In Comparative Examples 1 to 4, the reduction nitridation powder or the directly nitridized powder was used, and carbon or yttria was added as an additive. Examples 5 to 9 used the reduction nitridation powder, and 0.1 to 10 wt % of magnesium oxide was added. In these Examples, it is seen that the etching rate was conspicuously reduced, the thermal conductivity decreased, and the volume resistivity at high temperatures increased.

In Examples 10 to 24, the firing temperature in Examples 5 to 9 was varied, and similar results were obtained. In Examples 25 to 40, the directly nitridized powder was used, and similar results were obtained. In Examples 42 to 44, a nitrate, a chloride or a sulfate was used as a raw material before firing, instead of magnesium oxide, and similar results as in the case of magnesium oxide were obtained. In Examples 45 to 48, lithium was added in addition to magnesium. The content of lithium besides magnesium is preferably 0.5 wt % or less.

The aluminum nitride-based sintered bodies according to the present invention are suitable as various corrosion-resistant members due to its high corrosion resistance, particularly as corrosion-resistant members requiring corrosion resistance against a halogen-based corrosive gas. The aluminum nitride-based sintered body is suitable particularly for a corrosion-resistant member such as a susceptor in a semiconductor-producing apparatus. Further, the sintered body is suitable for a metal-buried article in which a metallic member is buried in such a corrosion-resistant member. As the corrosion-resistant member, a susceptor, a ring, a dome, etc. which are to be placed in the semiconductor-producing apparatus are preferred, by way of example. A resistively heating element, an electrostatically chucking electrode, a high frequency wave generating electrode or the like may be buried in the susceptor.

For example, as shown in FIG. 1(a), an entire part of a corrosion-resistant member 1A according to the present invention is made of a sintered body according to the invention. A corrosion-resistant face of the corrosion-resistant member 1A to be mainly exposed to the halogen-based gas is denoted by a reference numeral 2.

Figure 1B:
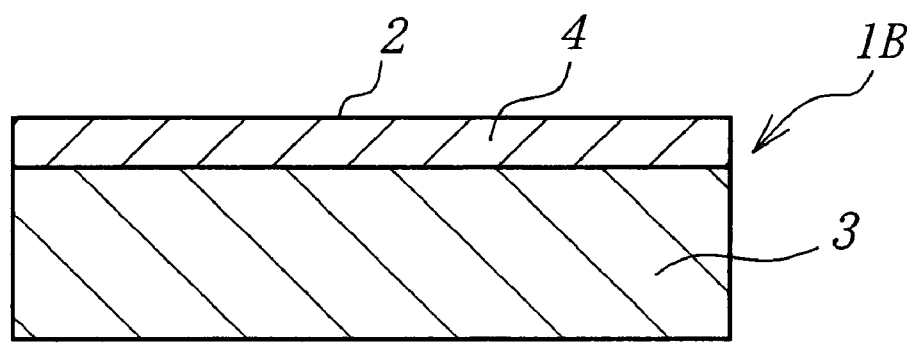

For example, as shown in FIG. 1(b), a corrosion-resistant member 1B includes a substrate 3, and a front surface layer 4 covering at least a part of the surface of the substrate 3. In this case, if the corrosion resistance is particularly regarded important, the surface layer 4 is made of a sintered body according to the present invention. The substrate 3 is preferably made of a ceramic material, and more particularly of an aluminum nitride sintered body containing no magnesium. In the semiconductor production, the content of metal element(s) other than aluminum in aluminum nitride constituting a part of the corrosion-resistant member is preferably not more than 1000 ppm.

Further, in another preferred embodiment according to the present invention, in FIG. 1(b), the substrate 3 is made of a sintered body according to the present invention. Particularly, if the corrosion-resistant surface layer is required to have a high volume resistivity at a use temperature, the substrate is made of the sintered body according to the present invention having a relatively high volume resistivity, and the surface layer 4 is made of another corrosion-resistant material. The material to constitute the surface layer is preferably aluminum nitride, and particularly preferably aluminum nitride containing 1000 ppm or less of metallic element(s) other than aluminum.

Figure 1C:
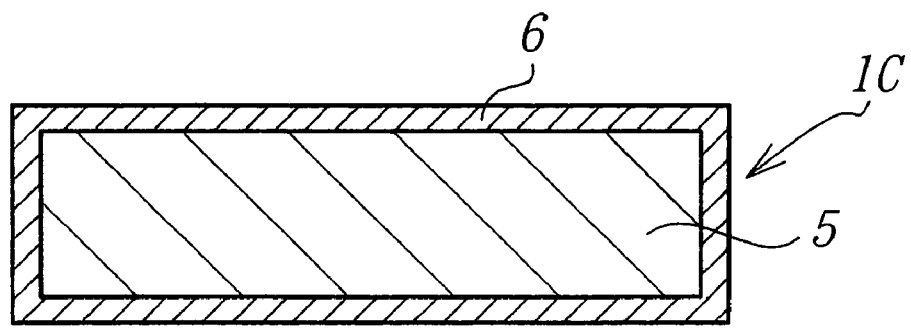

If the corrosion-resistant member is required to have high corrosion resistance over its entire periphery or entire surface, as a corrosion-resistant member Ic shown in FIG. 1(c), the entire surface of a substrate 5 is covered with a surface layer 6, and the surface layer 6 is made of a sintered body according to the present invention.

In the following, embodiments in which the present invention is applied particularly to a metal-buried article will be explained.

The metallic member, particularly an electrically conductive member, to be buried in the corrosion-resistant member, may be a conductive film formed by printing, and a planar metallic bulky member is particularly preferred. Herein, the "planar metallic bulky member" refers to a bulky body integrally formed by extending a metallic wire or a metallic plate two-dimensionally.

The metallic member is preferably made of a metal having a high melting point. As such a high melting point metal, tantalum, tungsten, molybdenum, platinum, rhenium, hafnium or alloys of any combination thereof may be recited. As articles to be treated, semiconductor wafers and aluminum wafers may be recited by way of example.

Figure 2:
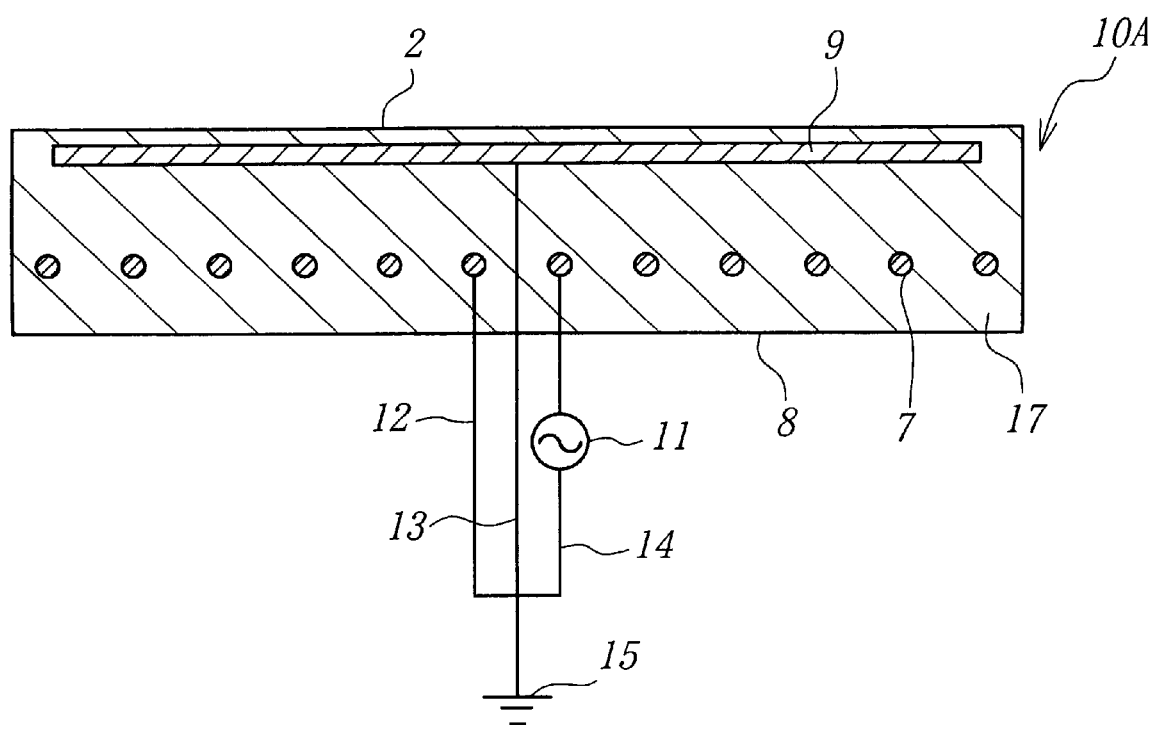
FIG. 2 is a sectional view schematically showing a metal-buried article 10A according to one embodiment of the present invention.
Figure 3:
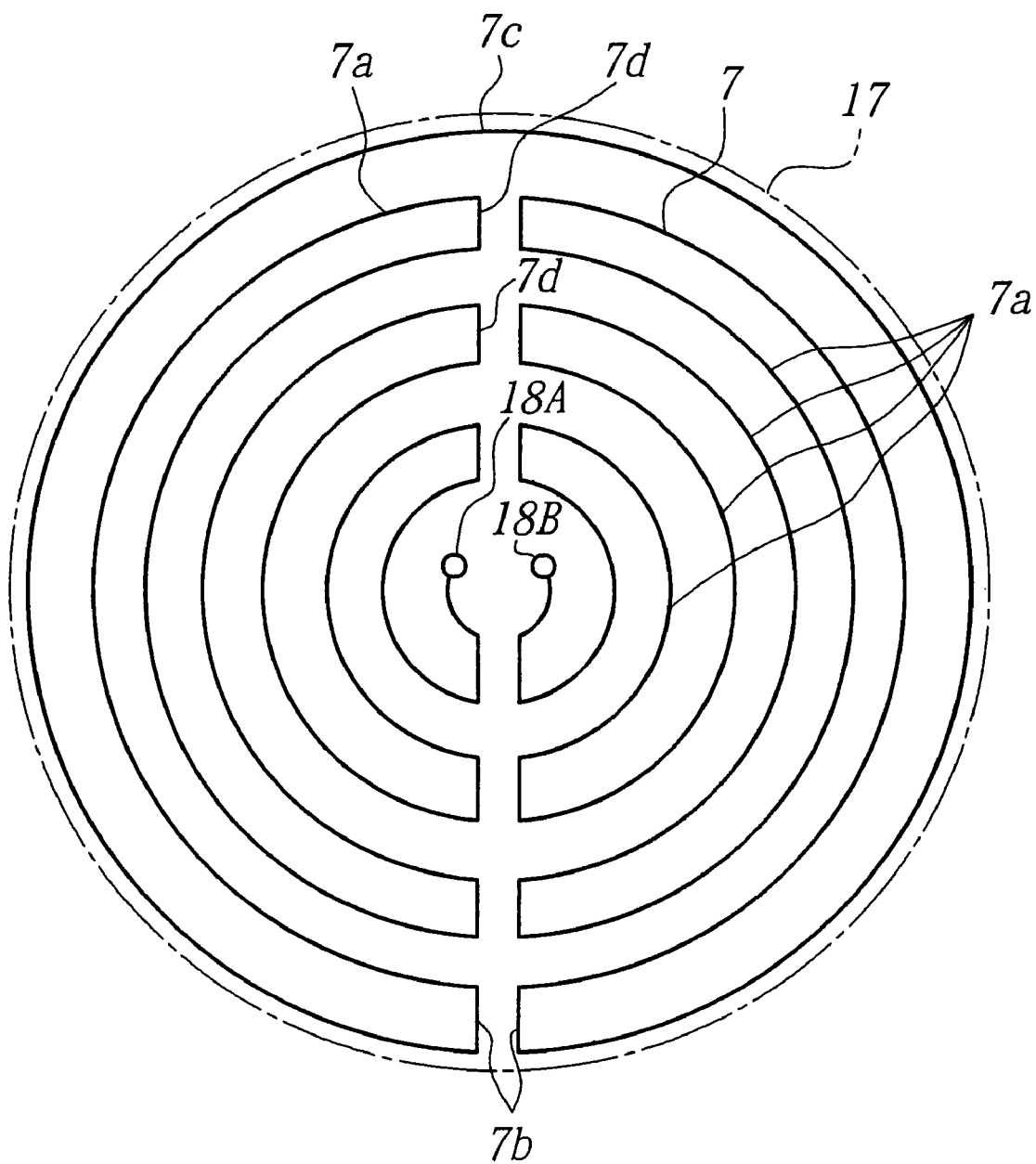
FIG. 3 is a sectional view showing a buried pattern of a resistive heating element 7 in the metal-buried article 10A in FIG. 2.

The metal-buried article according to the present invention includes a corrosion-resistant member and a metallic member buried in this corrosion-resistant member. In one embodiment, the entire corrosion-resistant member is made of a sintered body according to the present invention. FIG. 2 is a sectional view schematically showing a susceptor according to this embodiment. FIG. 3 is a schematic view showing a buried pattern of a resistively heating element.

The coiled resistively heating element 7 and an electrode 9 are buried in a corrosion-resistant member 17 of a metal-buried member 10A. The resistively heating element 7 is buried in a side of a rear surface 8, and the electrode 9 is buried in a side of the heating face 2. The buried plane shape of the resistively heating element 7 is schematically shown in FIG. 3 (In FIG. 3, only a coiled pattern of the heating element is shown). More specifically, a molybdenum wire is coiled to obtain a coiled body, and terminals 18A and 18B (not shown in FIG. 2) are joined to the opposite ends of the coiled body.

The entire resistively heating element 7 is arranged almost linearly symmetrically with respect to a line vertical to the paper face in FIG. 3. Plural concentric turns 7a having different diameters are linearly symmetrically arranged such that concentric turns 7a adjacent as viewed in a diametrical direction are continued to each other via a connection portion 7b. The outermost peripheral portion 7a is continued to a almost running around circular portion 7c via a connecting portion 7b.

A high frequency power source 11 for power supply is connected to a resistively heating element 7 via electric wires 12, 14, and connected to ground 15. The electrode 9 is connected to ground 15 via an electric wire 13.

EXAMPLE 49

A susceptor 10A having a configuration as shown in FIGS. 2 and 3 was produced. More particularly, a given amount of aluminum nitride power obtained by a reducing nitridizing method, 1.0 wt % of MgO powder, and an appropriate amount of an acrylic resin binder were added into isopropyl alcohol, which was mixed in a pot mill and dried and granulated by using a spray drying machine, thereby obtaining granulated powder. A coiled resistively heating element 7 and an electrode 9 made of molybdenum were buried in this granulated powder. As the electrode 9, a metal net obtained by knitting molybdenum wires each having a diameter of 0.4 mm at a density of 24 wires per inch was used. Terminals 18A and 18B were both received in one protective tube (not shown). The powder in this state was uniaxially press molded to obtain a discoidal molded body.

The molded body was placed in a hot press mold, sealed therein, and heated at a heating rate of 300° C./hour, while pressure was reduced in a temperature range of room temperature to 1000° C. After the temperature was raised, the nitrogen gas was introduced. The maximum temperature was set at 1800° C., and the molded body was held and fired at this maximum temperature for 4 hours in a nitrogen atmosphere under a hot press pressure of 200 kgf/cm$^2$, thereby obtaining a sintered body. The thus sintered body was mechanically worked, and finish worked to obtain a susceptor. The substrate had a diameter of 240 mm and a thickness of 18 mm, while a space was left at 6 mm between the resistively heating element and the heating surface.

The susceptor was subjected to a corrosion resistance test. The susceptor was placed in a chamber under a halogen gas atmosphere (chlorine gas: 300 sccm, nitrogen gas: 100 sccm, chamber internal pressure: 0.1 torr), and an electric power was fed to the resistively heating element, so that the temperature of the heating surface was kept at 735° C. and a high frequency plasma of an induction coupled plasma system was generated above the heating surface. An etching rate was determined based on a change in weight of the susceptor 24 after the susceptor was exposed to the plasma 24 hours. As a result, the etching rate was 2.3 μm/hr.

COMPARATIVE EXAMPLE 50

A heating device was produced as in the same way of Example 49, and subjected to the same test as above, provided that aluminum nitride only was used as a starting powder material, and no MgO was added. As a result, an etching rate was 4.8 μm/hr.

In a metal-buried article according to a further embodiment of the present invention, a high resistive layer made of an aluminum nitride sintered body of the present invention is interposed between a resistively heating element and an electrode. Thereby, operational unstability which would be caused by current leakage from the resistively heating element to the electrode can be prevented.

That is, it was discovered that when a high frequency-generating electrode apparatus was produced by burying a resistively heating element and a high frequency electrode in a substrate made of aluminum nitride and was operated in a high temperature range of, for example, not less than 600° C., the state of high frequency waves or the state of a high frequency plasma became unstable. Further, when an electrostatically chucking apparatus was produced by burying a resistively heating element and an electrostatically chucking electrode in a substrate made of aluminum nitride and was operated in a high temperature range of, for example, not less than 600° C., the electrostatically force also became unstable locally or with lapse of time in some cases. The present inventors discovered that current flowed between the heating element and the high frequency electrode, and such leaked current disturbed the state of the high frequency waves.

The inventors discovered that influences due to the leaked current can be suppressed or controlled by providing a highly resistive layer made of a sintered body according to the present invention between the heating surface and the heating element.

It is known that the volume resistivity of particularly aluminum nitride exhibits a semiconductive behavior, and decreases with increase in temperature. According to the present invention, the state of the high frequency waves and the state of the electrostatic attracting force can be stabilized even in a temperature range of 600° C. to 1200° C.

Figure 4:
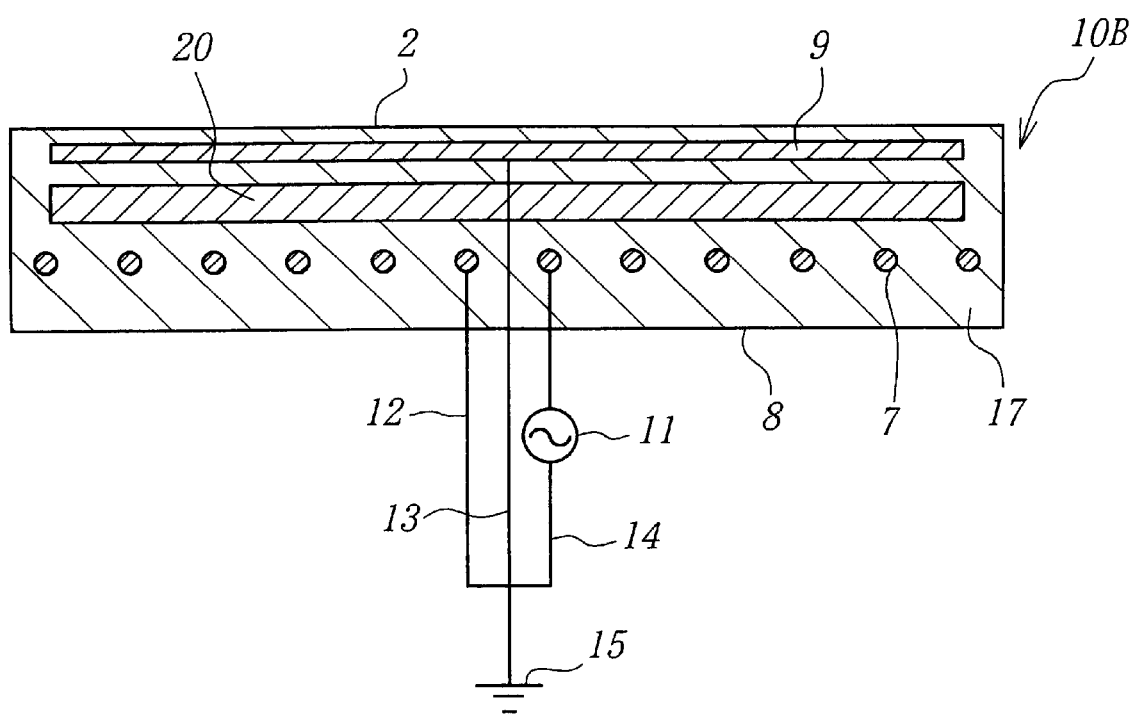
FIG. 4 is a sectional view schematically showing a metal-buried article 10B according to another embodiment of the present invention.

FIG. 4 is a sectional view schematically showing a metal-buried article 10B according to this embodiment. The same portions as in FIG. 2 are denoted by the same reference numerals, and explanation thereof is omitted. In this metal-buried article 10B, a highly resistive layer 20 is interposed between an electrode 9 and a resistively heating element 7.

In a metal-buried article according to a further embodiment, a corrosive-resistive member includes a substrate and a surface layer covering at least a part of the surface of the substrate. In this case, the surface layer may be made of a sintered body according to the present invention, so that the maximum corrosion resistance can be obtained. In this case, it is preferable that the substrate is made of aluminum nitride, and the content of metals other than aluminum contained in the aluminum nitride is not more than 1000 ppm.

In a further embodiment, a corrosion-resistive member includes a substrate and a surface layer covering at least a part of the surface of the substrate, and the substrate is made of a sintered body according to the present invention. In this case, diffusion of heat can be suppressed by decreasing the thermal conductivity of the substrate, whereas the leakage of current to the substrate can be prevented because the volume resistivity of the substrate at high temperatures is high. In this case, the surface layer is made of aluminum nitride, and the content of metal(s) other than aluminum contained in the aluminum nitride is not more than 1000 ppm.

In any case, the substrate and the surface layer are preferably integrally sintered. In this case, the content of magnesium in the sintered body according to the present invention is preferably not more than 5 wt % as calculated in the form of an oxide thereof so that stress due to difference in coefficient of thermal expansion between the substrate and the surface layer may be mitigated.

It is preferable that the resistively heating element is buried in the substrate and the electrode is buried in the substrate or the surface layer.

Figure 5:
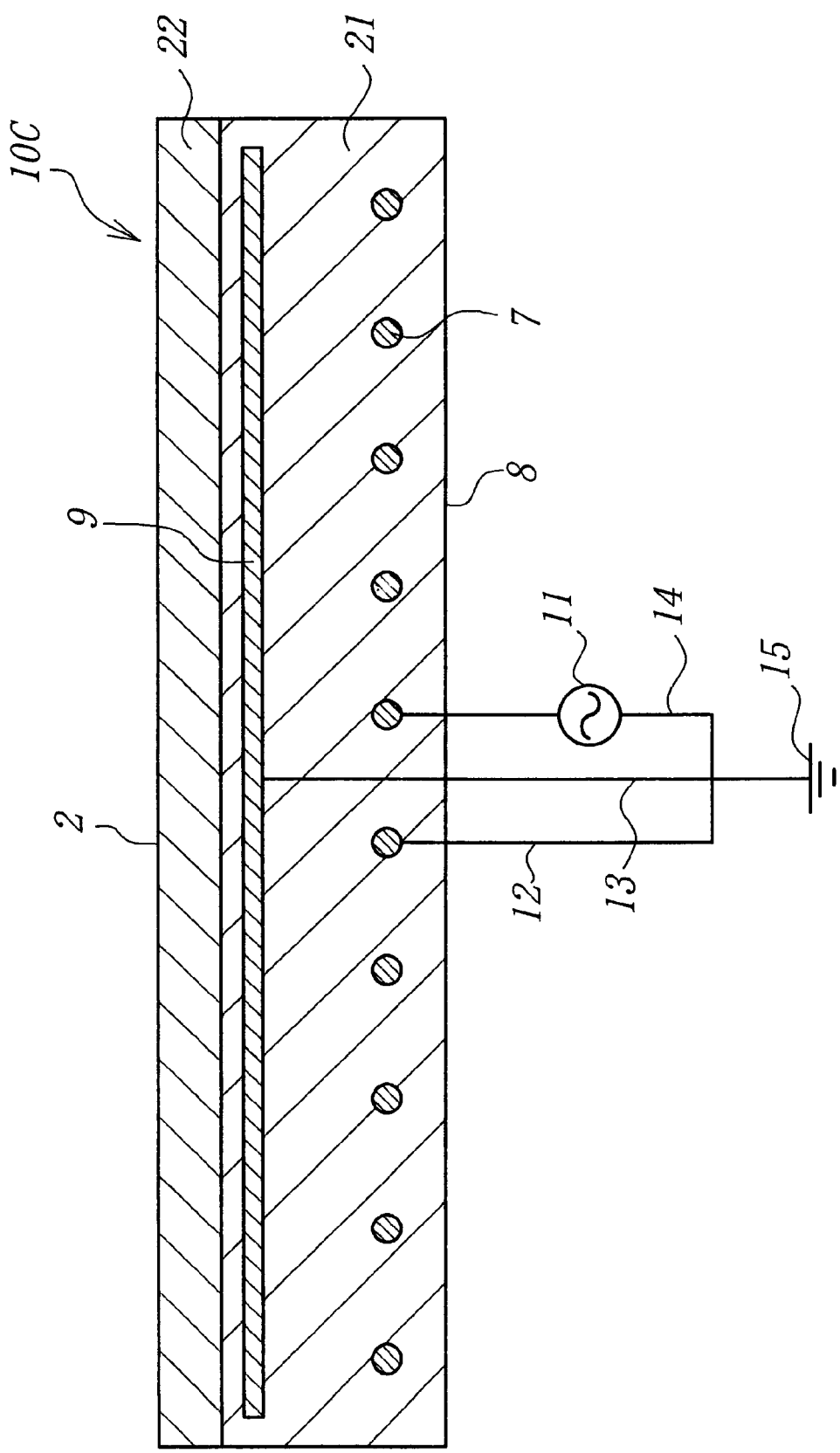
FIG. 5 is a sectional view schematically showing a metal-buried article 10C according to a further embodiment of the present invention.
Figure 6:
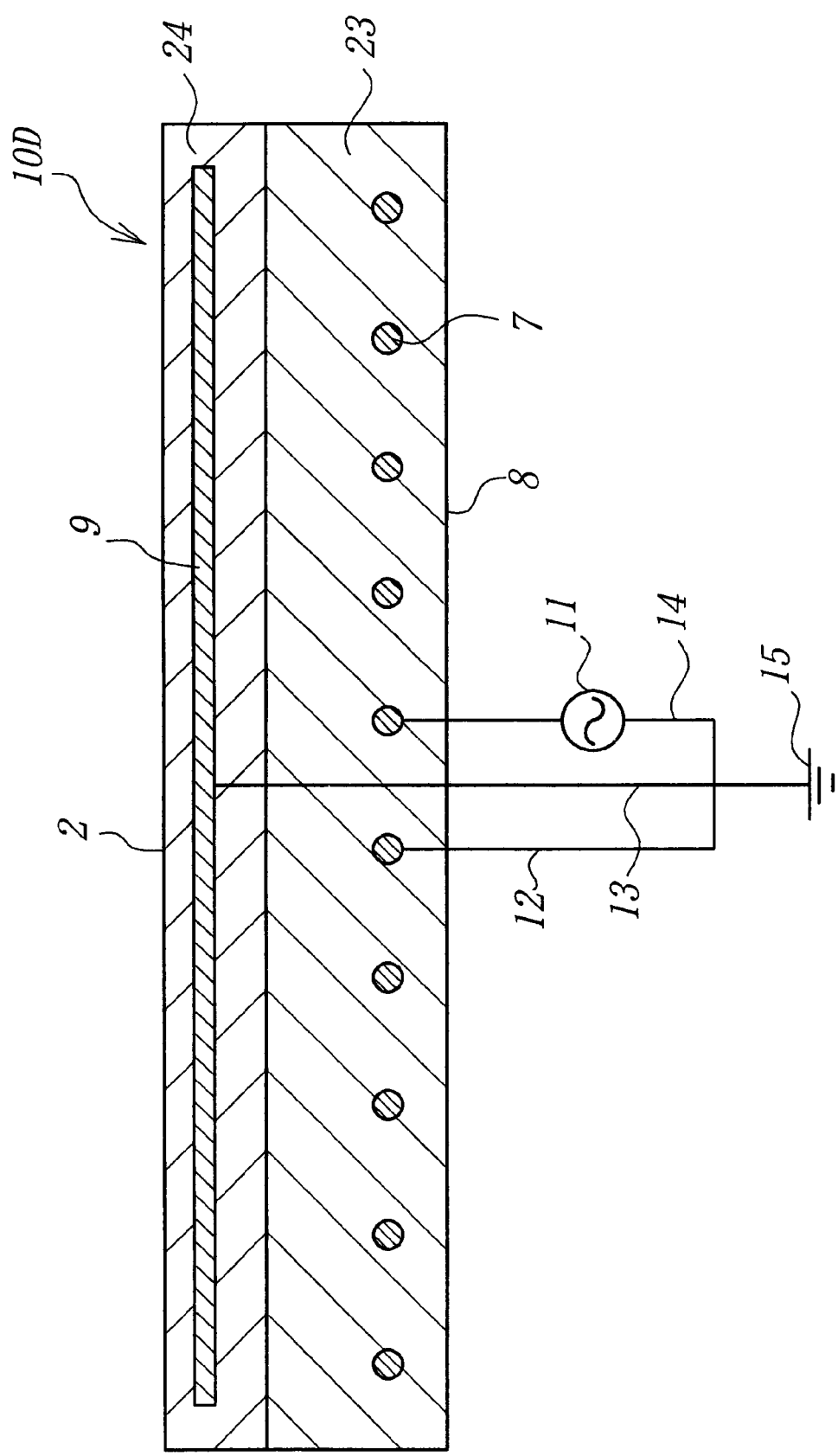
FIG. 6 is a sectional view schematically showing a metal-buried article 10D according to a still further embodiment of the present invention.

FIGS. 5 and 6 are sectional views schematically showing metal-buried articles 10C and 10D according to further embodiments of the present invention, respectively. In FIG. 5, a resistively heating element 7 and an electrode 9 are buried in a substrate 21, and a surface layer 22 is formed between the electrode 9 and the heating surface 2. In FIG. 6, a resistively heating element 7 is buried in a substrate 23, and an electrode 9 is buried in a surface layer 24.

EXAMPLES 51, 52

A metal-buried article (Example 51) as shown in FIG. 5 and a metal-buried article (Example 52) as shown in FIG. 6 were produced. More specifically, a given amount of aluminum nitride power obtained by a reduction nitridation method, 5.0 wt % of MgO powder, and an appropriate amount off an acrylic resin binder were added into isopropyl alcohol, which was mixed in a pot mill and dried and granulated by using a spray drying machine, thereby obtaining granulated powder. In the embodiment of FIG. 5, a coiled resistively heating element 7 and an electrode 9 as shown in Example 49 were buried in this granulated powder. In the embodiment of FIG. 6, only such a resistively heating element 7 was buried. Each of the resulting powders was subjected to a uniaxial press molding, thereby obtaining a molded body corresponding to the substrate 21, 23.

Further, a given amount of aluminum nitride power obtained by a reducing nitridizing method, 0.05 wt % of a phenol resin as calculated in the form of carbon, acrylic resin binder were added into isopropyl alcohol, which was mixed in a pot mill and dried and granulated by using a spray drying machine, thereby obtaining granulated powder. As shown in FIGS. 5 and 6, a surface layer 22, 24 was uniaxially press molded through being laminated upon the above molded body for the substrate. In FIG. 6, an electrode 9 was buried in the surface layer 24.

Each of the thus obtained molded bodies was placed in a hot press mold, sealed therein, and heated at a heating rate of 300° C./hour. In this case, the pressure was reduced in a temperature range of room temperature to 1000° C. As the temperature was raised, the pressure rose. After the temperature was raised, the nitrogen gas was introduced. The maximum temperature was set at 1800° C., and the molded body was held and fired at this maximum temperature for 4 hours in a nitrogen atmosphere under a hot press pressure of 200 kgf/cm$^2$, thereby obtaining a sintered body. The thus sintered body was mechanically worked, and finish worked to obtain a susceptor. The substrate had a diameter of 240 mm and a thickness of 18 mm, while a space of 6 mm was left between the resistively heating element 7 and the heating surface 2.

The leak current from the resistively heating element 7 to the electrode 9 was measured at each of 500, 600 and 700° C. in vacuum in the state that an electric wire was passed through a clamp meter. Further, a difference between the maximum temperature and the minimum temperature at the heating surface was measured as an index of the operation as the electrically conductive parts when the operation temperature was 700° C.

As a result, in each of Examples 51 and 52, no leaked current was measured for each temperature, and the above temperature difference was 10° C. The measurement of the etched rate under the same condition as in Example 49 revealed that it was 4.3 $\mu$m/hour for each of Examples 51 and 52.

In a further embodiment according to the present invention, a metallic member is buried in an intermediate layer made of a sintered body of the present invention. Particularly preferably, an electrode is buried in the intermediate layer. By so doing, the leaked current from the electrode, particularly the leaked current between the electrode and another metallic member such as a resistively heating element can be prevented.

Figure 7:
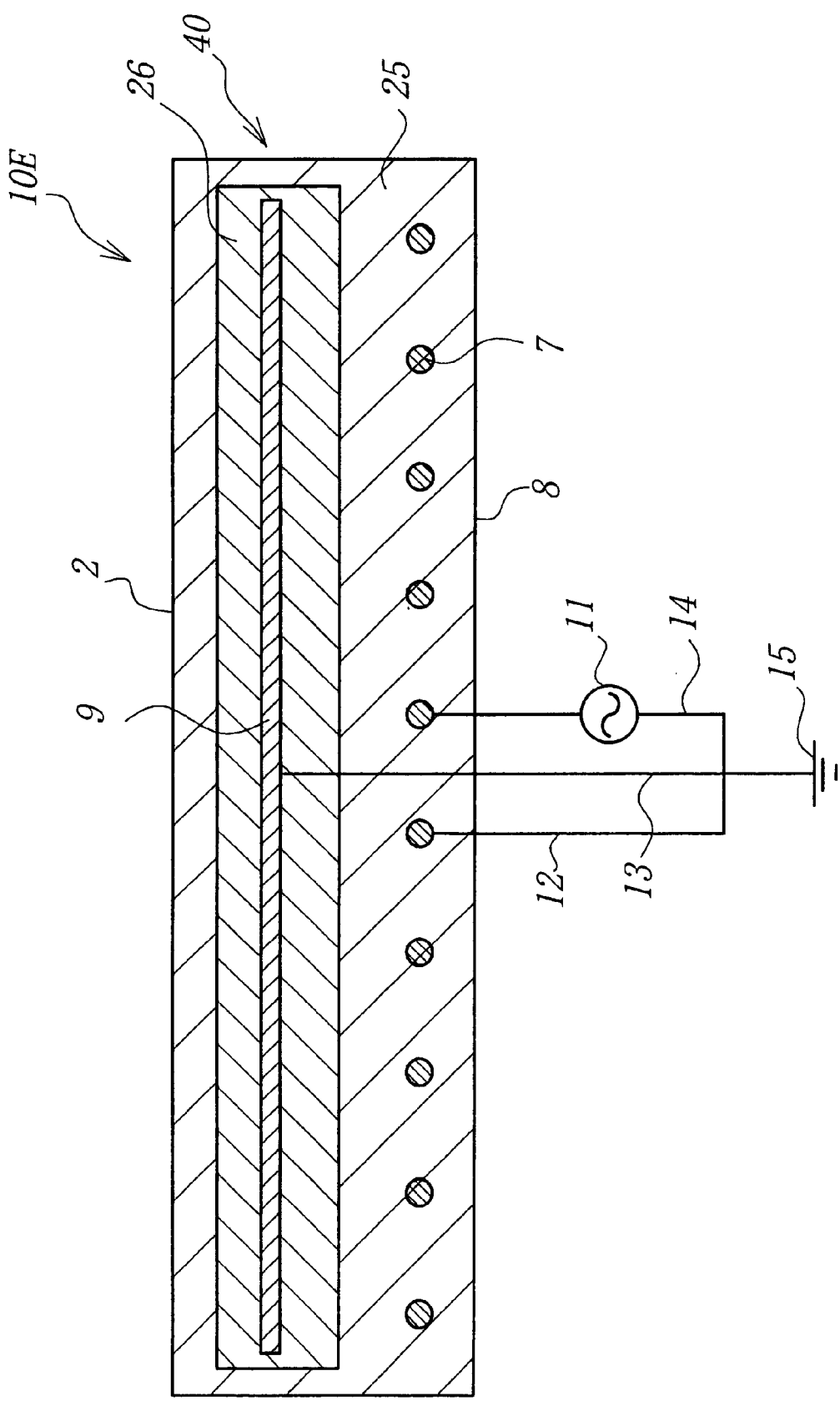
FIG. 7 is a sectional view schematically showing a metal-buried article 10E according to a still further embodiment of the present invention.

FIG. 7 is a sectional view schematically showing a metal-buried article 10E according to this embodiment. In this metal-buried article 10E, a resistively heating element 7 is buried in a substrate 25 of a corrosive member 40, and an intermediate layer 26 is provided between the resistively heating element 7 and a heating surface 2. An electrode 9 is buried in the intermediate layer 26. In this embodiment, the entire intermediate layer 26 is buried in the substrate 25, but an end portion of the intermediate layer 26 may be exposed to the surface of the corrosion-resistive member 40.

EXAMPLE 53

A susceptor as shown in FIG. 7 was produced. More specifically, a given amount of aluminum nitride power obtained by a reduction nitridation method, 0.05 wt % of a phenol resin as calculated in the form of carbon, an appropriate amount of an acrylic resin binder were added into isopropyl alcohol, which was mixed in a pot mill and dried and granulated by using a spray drying machine, thereby obtaining granulated powder. As shown in FIG. 7, a coiled resistively heating element 7 made of molybdenum as shown in Example 49 was buried, thereby obtaining a molded body for a substrate.

Further, a given amount of aluminum nitride power obtained by a reducing nitridizing method, 5.0 wt % of MgO powder, and an appropriate amount of an acrylic resin binder were added into isopropyl alcohol, which was mixed in a pot mill and dried and granulated by using a spray drying machine, thereby obtaining granulated powder. An electrode 9 was buried in this granulated powder, which was laminated upon the above molded body of the substrate. Then, the combined powders were uniaxially press molded to attain a configuration as shown in FIG. 7.

The thus obtained molded body was placed in a hot press mold, sealed therein, and heated at a heating rate of 300° C./hour. In this case, the pressure was reduced in a temperature range of room temperature to 1000° C. After the temperature was raised, the nitrogen gas was introduced. the maximum temperature was set at 1800° C., and the molded body was held and fired at this maximum temperature for 4 hours in a nitrogen atmosphere under a hot press pressure of 200 kgf/cm$^2$, thereby obtaining a sintered body. The thus sintered body was mechanically worked, and finish worked to obtain a heater. The substrate had a diameter of 240 mm and a thickness of 18 mm, while a space of 6 mm was left between the resistively heating element and the heating surface.

The leak current from the resistively heating element 7 to the electrode 9 was measured at each of 500, 600 and 700° C. in vacuum in the state that an electric wire was passed through a clamp meter. Further, a difference between the maximum temperature and the minimum temperature at the heating surface was measured as an index of the operation as the electrically conductive parts when the operation temperature was 700° C.

As a result, no leaked current was measured for each temperature, and the above temperature difference at the heating surface was 10° C. The measurement of the etching rate under the same condition as in Example 49 revealed that it was 4.3 $\mu$m/hour.

COMPARATIVE EXAMPLE 54

A susceptor was produced in the same way as in Example 53, and subjected to the same experiment as mentioned above. More specifically, a given amount of aluminum nitride power obtained by a reducing nitridizing method, 0.05 wt % of a phenol resin as calculated in the form of carbon, acrylic resin binder were added into isopropyl alcohol as starting materials, which was mixed in a pot mill and dried and granulated by using a spray drying machine. No highly resistive layer was provided.

As a result, the leaked current was 2 mA for 500° C., 9 mA for 600° C. and 45 mA for 700° C. A difference in temperature at the heating surface was 50° C. It was clarified that such a large temperature difference at the heating surface occurred due to the fact that since the electric insulation between the heating element and the high frequency electrode became lower at high temperatures, a part of current flowing the heating element leaked to the high frequency electrode, and that one this current leakage (leaked current) occurred, it causes the current to concentrate around there to form a hot spot.

Measurement of an etching rate the same manner as in Example 49 revealed that it was 4.4 $\mu$m/hour. Therefore, the susceptor according to the present invention can be used as a heater operable at temperatures higher than in the prior art.

The semiconductor-holding apparatus according to the present invention comprises a susceptor having a corrosion-resistive face to be exposed to a halogen-based gas plasma and a rear face, and a heat-insulating portion provided at the rear surface of the susceptor and adapted to limit a heat flow from the susceptor, wherein at least a part of the heat-insulating portion is made of the aluminum nitride-based sintered body according to the present invention. As the susceptor, the susceptor or the metal-buried article may be used. Particularly preferably, the susceptor is made of aluminum nitride containing no magnesium or the aluminum nitride-based sintered body.

In recent years, it has been demanded that the diameter of the wafer is increased or the liquid crystal panel is made larger for the production of semiconductor elements. Owing to this, it has been demanded that the susceptor is made larger. It has been demanded that the diameter of the susceptor is for example 30 mm or more. However, as the diameter of the susceptor increases, it becomes very difficult to keep the uniformity of the temperature at the heating surface. For, if there are variations in the temperature at the heating surface, unacceptable products are produced. Even if the susceptor is made larger, the temperature at the heating surface can be made uniform by the provision of the heat-insulating portion.

Figure 8:
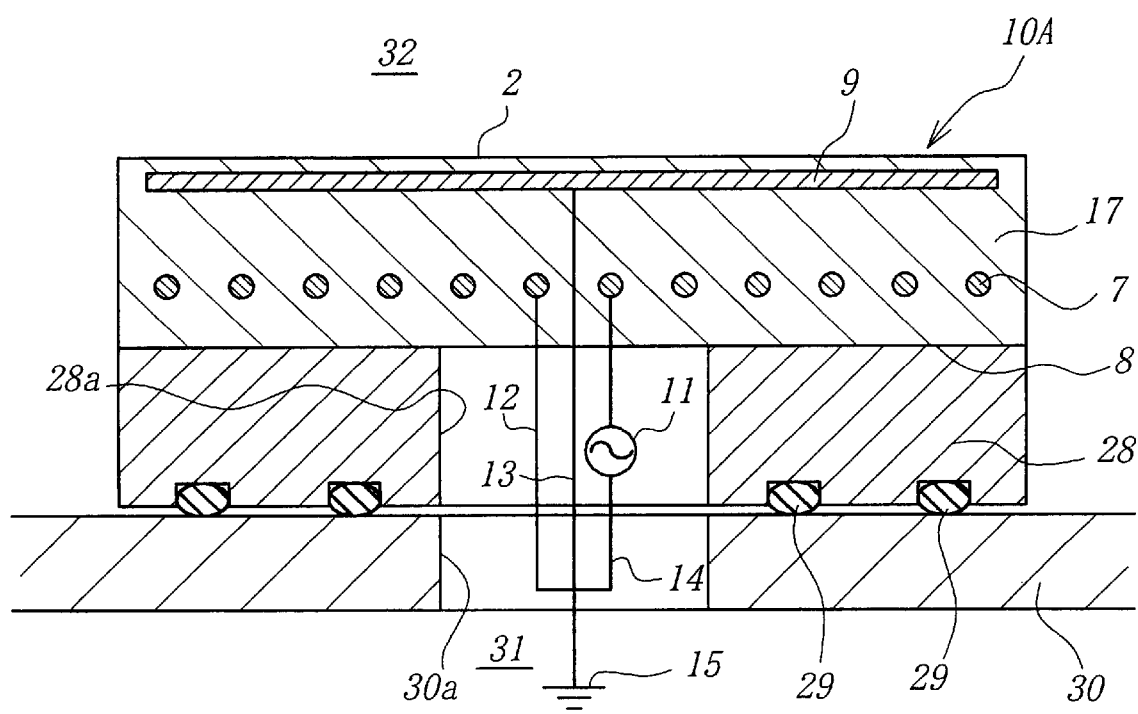
FIG. 8 is a sectional view schematically showing a semiconductor-holding apparatus according to one embodiment of the present invention.

FIG. 8 is a sectional view of schematically showing a susceptor according to this embodiment. Although the construction of the susceptor as the metal-buried article is the same as mentioned above, the present embodiment may be formed of an aluminum nitride-based sintered body according to the present invention or an aluminum nitride-based sintered body containing no magnesium. A heat-insulating portion 28 is provided at a side of a rear surface 8 of the susceptor 10A, and the heat-insulating portion 28 is attached to an outer wall 30 of a chamber via O-rings 29. A hollow portion 28a is formed in a central portion of the heat-insulating portion 28, and a through-hole 30a is also formed in the outer wall 30 so that the hollow portion 28a and the through-hole 30a may be communicated with each other and electric wires may be received therein. A halogen-based corrosive gas is flown in a space 32 at a side of the corrosive-resistant surface 2 of the susceptor, whereas an outer space 31 of the outer wall 30 of the chamber is ordinarily exposed to open air.

EXAMPLE 55

A given amount of aluminum nitride power obtained by a reduction nitridation method, 0.05 wt % of a phenolic resin as calculated in the form of carbon, and an appropriate amount off an acrylic resin binder were added into isopropyl alcohol, which was mixed in a pot mill and dried and granulated by using a spray drying machine, thereby obtaining granulated powder. As shown in FIG. 8, a coiled resistively heating element 7 and an electrode 9 made of molybdenum as shown in Example 49 were buried in this granulated powder. The resulting powder was subjected to a uniaxial press molding, thereby obtaining a discoidal molded body for a susceptor.

Further, a given amount of aluminum nitride power obtained by a reduction nitridation method, 10.0 wt % of MgO, and an appropriate amount of an acrylic resin binder were added into isopropyl alcohol, which was mixed in a pot mill and dried and granulated by using a spray drying machine, thereby obtaining granulated powder. A layer of this granulated powder was placed on the molded body for the susceptor, which was uniaxially press molded, thereby obtaining a laminate molded body of the heat-insulating portion 29 and the susceptor.

The thus obtained molded body was placed in a hot press mold, sealed therein, and heated at a heating rate of 300° C./hour. In this case, the pressure was reduced in a temperature range of room temperature to 1000° C. After the temperature was raised, the nitrogen gas was introduced. As the temperature rose, the pressure increased. The maximum temperature was set at 2000° C., and the molded body was held and fired at this maximum temperature for 4 hours in a nitrogen atmosphere under a hot press pressure of 200 kgf/cm$^2$, thereby obtaining a sintered body. The thus sintered body was mechanically worked to obtain a susceptor. The substrate had a diameter of 240 mm and a thickness of 18 mm, while a space of 6 mm was left between the resistively heating element 7 and the heating surface 2. Further, the thickness of the heat-insulating portion 28 was 20 mm. In order to form terminals of a circuit to be mentioned later, a hollow portion 28a having a diameter of 50 mm was formed in a central portion of the heat-insulating portion 28. At a rear surface of the heat-insulating portion are formed O-ring grooves.

An electric power was fed to the resistively heating element 8. When the O-rings reached its heat-withstanding limit of 200° C., the heating surface 2 was at 350° C.

COMPARATIVE EXAMPLE 56

A semiconductor holder having a configuration as shown in FIG. 8 was produced in the same manner as in Example 55. In Example 56, a heat-insulating portion was made of a granulated powder which was obtained as in the case of the susceptor by mixing a given amount of aluminum nitride power obtained by a reduction nitridation method, 0.05 wt % of a phenolic resin as calculated in the form of carbon, and an appropriate amount of an acrylic resin binder into isopropyl alcohol, mixing them in a pot mill, drying and granulating the mixture by using a spray drying machine.

An electric power was fed to the resistively heating element 8. When the O-rings reached its heat-withstanding limit of 200° C., the heating surface 2 was at 230° C.

COMPARATIVE EXAMPLE 57

A semiconductor holder having a configuration as shown in FIG. 8 was produced in the same manner as in Example 55. In this Comparative Example, a heat-insulating portion was made of a granulated powder which was obtained as in the case of the susceptor by mixing commercially available silicon nitride power having the average particle diameter of 2 $\mu$m, 2.0 wt % of MgO, and an appropriate amount of an acrylic resin binder into isopropyl alcohol, mixing them in a pot mill, drying and granulating the mixture by using a spray drying machine. The hot press firing temperature was 1800° C.

After the hot press firing, the heat-insulating portion was separated from the susceptor, so that an integrated heater could not be produced. This was considered to be caused by a difference in thermal expansion between aluminum nitride and silicon nitride. Therefore, according to the present invention, the aluminum nitride heater having excellent heat insulator can be provided, and the heater can be easily attached to the chamber.

Figure 9:
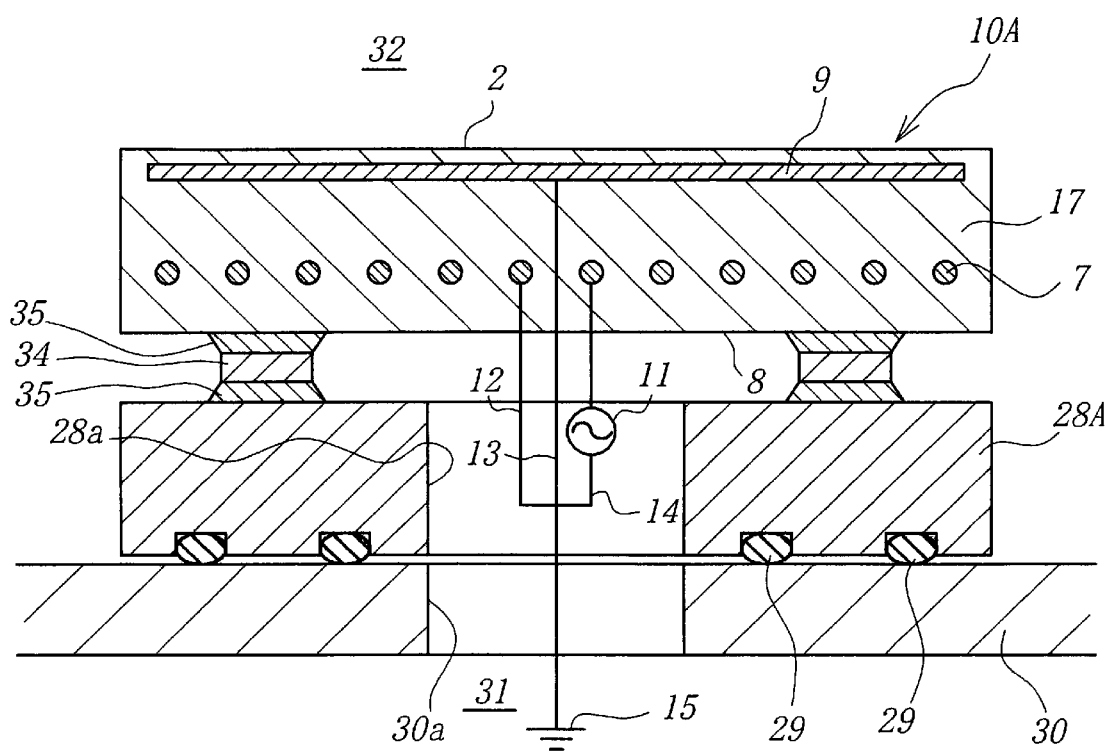
FIG. 9 is a sectional view schematically showing a semiconductor-holding apparatus according to another embodiment of the present invention.

FIG. 9 is a sectional view of schematically showing a semiconductor holder according to a further embodiment of the present invention. The same numerical numbers as in FIG. 8 are given to the same parts, and explanation thereof is omitted. In this embodiment, a ring-shaped spacer 34 made of, for example, molybdenum, is interposed between a heat-insulating portion 28A and a rear surface 8 of a susceptor 10A, while the spacer 34 is bonded to the heat-insulating portion 28A and a rear surface 8 of a susceptor 17 via bonding layers 35, 35.

EXAMPLE 58

A semiconductor holder having a configuration as shown in FIG. 9 was produced.

More specifically, a given amount of aluminum nitride power obtained by a reduction nitridation method, 0.05 wt % of a phenol resin as calculated in the form of carbon, an appropriate amount of an acrylic resin binder were added into isopropyl alcohol, which was mixed in a pot mill and dried and granulated by using a spray drying machine, thereby obtaining granulated powder. A coiled resistively heating element 7 and an electrode made of molybdenum as shown in Example 49 was buried in the granulated powder, which was uniaxially press molded to obtain a molded body for a susceptor 10A.

The thus obtained molded body was placed in a hot press mold, sealed therein, and heated at a heating rate of 300° C./hour. In this case, the pressure was reduced in a temperature range of room temperature to 1000° C. After the temperature was raised, the nitrogen gas was introduced. The maximum temperature was set at 1800° C., and the molded body was held and fired at this maximum temperature for 4 hours in a nitrogen atmosphere under a hot press pressure of 200 kgf/cm$^2$, thereby obtaining a sintered body. The thus sintered body was mechanically worked to obtain a susceptor 10A. The susceptor 10A had a diameter of 240 mm and a thickness of 18 mm.

Separately from this, a given amount of aluminum nitride power obtained by a reduction nitridation method, 10.0 wt % of MgO powder, and an appropriate amount of an acrylic resin binder were added into isopropyl alcohol, which was mixed in a pot mill and dried and granulated by using a spray drying machine, thereby obtaining granulated powder.

The thus granulated powder was uniaxially press molded to obtain a molded body, which was placed in a hot press mold, and sealed therein. The molded body was fired in the same condition as in the case of the susceptor 10A except that the maximum temperature was set at 2000° C. Thereby, a sintered body was obtained. The sintered body was mechanically worked to obtain a heat-insulating portion 28A having a diameter of 240 mm, an inner diameter of 50 mm and a thickness of 18 mm. At one surface of the heat-insulating portion 28A were formed O-ring grooves.

The susceptor and the heat-insulating portion were bonded together via a ring (outer diameter:220 mm, width of 5 mm, and thickness:1 mm) made of molybdenum having a thermal expansion near to that of aluminum nitride with use of a commercially available Al brazing material through heating at 610° C. in vacuum, thereby obtaining a semiconductor holder as shown in FIG. 9.

An electric power was fed to the resistively heating element. When the O-rings reached its heat-withstanding limit of 200° C., the heating surface was at 340° C.

COMPARATIVE EXAMPLES 59, 60

A semiconductor holder was produced in the same manner as in Example 58, provided that the same materials as in the case of the susceptor were used for a heat-insulating portion in Comparative Example 59.

In Comparative Example 60, as a heat-insulating portion 28A was used a granulated powder which was obtained by mixing commercially available silicon nitride power having the average particle diameter of 2 μm, 2.0 wt % of MgO, and an appropriate amount of an acrylic resin binder into isopropyl alcohol, mixing them in a pot mill, and drying and granulating the mixture by using a spray drying machine. The hot press firing temperature was 1800° C.

In Comparative Example 59, an electric power was fed to the resistively heating element. When the O-rings reached its heat-withstanding limit of 200° C., the heating surface of the heater was at 230° C.

In Comparative Example 60, after the heat-insulating portion was brazed to the susceptor, mainly the susceptor was broken, so that a semiconductor holder could not be produced. It is considered that the aluminum nitride having a relatively smaller strength was broken due to difference in thermal expansion between aluminum nitride and silicon nitride.

Figure 10:
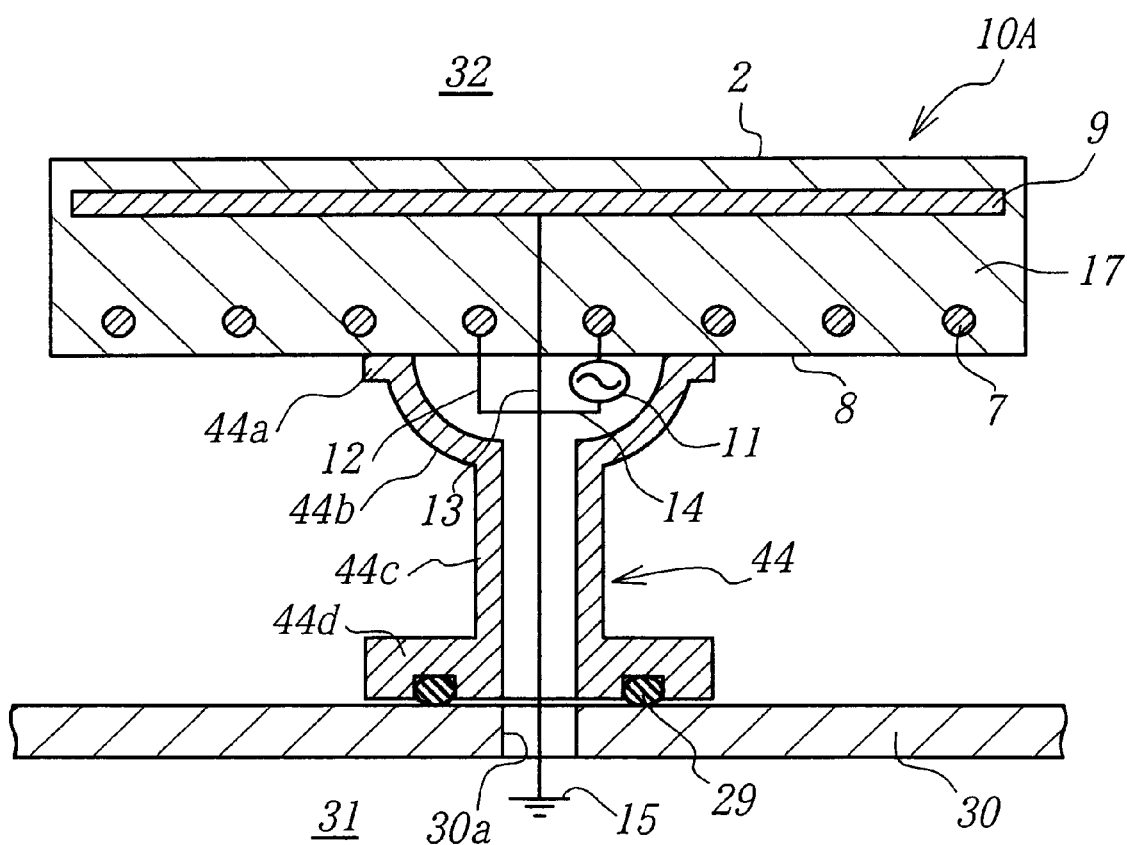
FIG. 10 is a sectional view schematically showing a semiconductor-holding apparatus according to a further embodiment of the present invention.

The semiconductor holder according to the present invention has a support member provided at a rear surface of the susceptor for supporting the susceptor from the back face thereof. FIG. 10 is a sectional view schematically showing a semiconductor holder according to this embodiment.

A support tube 44 is provided at a rear surface 8 of a susceptor 10A. The support tube 44 includes a main body 44c, a flange portion 44b provided at one end of the main body 44c, and another flange portion 44d provided at the other of the main body 44c. The support tube further includes such a diameter-enlarging portion 44b that the diameter of the support tube gradually increases as the location goes from the main body to a remote end of the flange portion 44a. The flange portion 44a of the support tube 44 is joined to the rear surface of the susceptor.

EXAMPLE 61

A semiconductor holder having a configuration as shown in FIG. 10 was produced.

More specifically, a given amount of aluminum nitride power obtained by a reducing nitridizing method, 0.05 wt % of a phenol resin as calculated in the form of carbon, an appropriate amount of an acrylic resin binder were added into isopropyl alcohol, which was mixed in a pot mill and dried and granulated by using a spray drying machine, thereby obtaining granulated powder. A coiled resistively heating element 7 and an electrode made of molybdenum as shown in Example 49 were buried in the granulated powder, which was uniaxially press molded to obtain a molded body having a configuration as shown in FIG. 10.

The thus obtained molded body was placed in a hot press mold, sealed therein, and heated at a heating rate of 300° C./hour. In this case, the pressure was reduced in a temperature range of room temperature to 1000° C. After the temperature was raised, the nitrogen gas was introduced. The maximum temperature was set at 1800° C., and the molded body was held and fired at this maximum temperature for 4 hours in a nitrogen atmosphere under a hot press pressure of 200 kgf/cm$^2$, thereby obtaining a sintered body. The thus sintered body was mechanically worked to obtain a susceptor. The susceptor had a diameter of 240 mm and a thickness of 18 mm.

Separately from this, a given amount of aluminum nitride power obtained by a reduction nitridation method, 10.0 wt % of MgO powder, and an appropriate amount of an acrylic resin binder were added into isopropyl alcohol, which was mixed in a pot mill and dried and granulated by using a spray drying machine, thereby obtaining granulated powder. The thus granulated powder was uniaxially press molded to obtain a molded body, which was placed in a hot press mold, and sealed therein. The molded body was fired in the same condition as in the case of the susceptor except that the maximum temperature was set at 2000° C. Thereby, a sintered body was obtained. The sintered body was mechanically worked to obtain a support member (support tube), as shown in FIG. 10. A main body 44c of the support tube had a thickness of 2.5 to 3.5 mm and an outer diameter of 35 mm. A flange portion 44a had an outer diameter of 50 mm and a thickness of 4 mm. A flange portion 44d had an outer diameter of 50 mm and a thickness of 8 mm. At an end surface of the flange portion 44d was formed an O-ring groove.

The susceptor and the support tube were preliminarily plated with nickel at their portions to be joined to each other, and assembled and joined together with use of a commercially available Al brazing material by heating at 610° C. in vacuum, thereby obtaining a semiconductor holder as shown in FIG. 10.

An electric power was fed to the resistively heating element. When the O-rings reached its heat-withstanding limit of 200° C., the heating surface was at 650° C.

COMPARATIVE EXAMPLES 62 and 63

A semiconductor holder was produced in the same manner as in Example 61, provided that the same materials as in the case of the substrate were used for a support tube in Comparative Example 62.

In Comparative Example 63, as a material for a support tube was used a granulated powder which was obtained by mixing commercially available silicon nitride power having the average particle diameter of 2 μm, 2.0 wt % of MgO, and an appropriate amount of an acrylic resin binder into isopropyl alcohol, mixing them in a pot mill, and drying and granulating the mixture by using a spray drying machine. The hot press firing temperature was 1800° C.

In Comparative Example 62, an electric power was fed to the resistively heating element. When the O-rings reached its heat-withstanding limit of 200° C., the heating surface of the heater was at 420° C.

In Comparative Example 63, after the heat-insulating portion was brazed to the susceptor, mainly the substrate of the susceptor was broken, so that a susceptor could not be produced. It is considered that the aluminum nitride having a relatively smaller strength was broken due to difference in thermal expansion between aluminum nitride and silicon nitride.

What is claimed is:

1. An aluminum nitride-based sintered body comprising aluminum nitride as a main ingredient and magnesium and having a polycrystalline structure composed of aluminum nitride crystals, wherein said magnesium is contained in an amount of not less than 0.1 wt % as calculated in the form of its oxide.

2. The aluminum nitride-based sintered body as set forth in claim 1 which has a volume resistance at 700° C. being not less than $1 \times 10^7$ Ω·cm.

3. The aluminum nitride-based sintered body as set forth in claim 2, which has a thermal conductivity of not more than 80 W/m·K.

4. The aluminum nitride-based sintered body as set forth in claim 3, wherein at least a part of said magnesium is solid-solved in the aluminum nitride crystals, and a constituent phase is substantially regarded as a single phase of aluminum nitride as judged by an X-ray diffraction.

5. The aluminum nitride-based sintered body as set forth in claim 4, wherein the content of a metallic impurity excluding magnesium is not more than 600 ppm.

6. A corrosion-resistant member composed at least partially of the aluminum nitride-based sintered body as set forth in claim 4.

7. A metal-buried article comprising a corrosion-resistant member, and a metallic member buried in the corrosion-resistant member, wherein at least a part of the corrosion-resistant member is made of the aluminum nitride-based sintered body as set forth in claim 4.

8. The metal-buried article set forth in claim 7, wherein a resistive heating member is buried, as the metallic member, in the corrosion-resistant member, and a heating face is provided at the corrosion-resistant member.

9. The metal-buried article set forth in claim 8, wherein an electrode is buried, as the metallic member, in the corrosion-resistant member in addition to the resistive heating member, the electrode being provided between the resistive heating member and the heating face.

10. The metal-buried article set forth in claim 9, wherein the electrode is an electrode functioning as at least one of an electrostatically chucking electrode and a high frequency wave generating electrode.

11. The metal-buried article set forth in claim 9, wherein a highly resistive layer is interposed between the resistive heating member and the electrode, and the highly resistive layer is made of said aluminum nitride-based sintered body.

12. A semiconductor-holding apparatus comprising a susceptor having a corrosion-resistive face to be exposed to a halogen based gas plasma and a rear face, and a heat-insulating portion provided at the rear surface of the susceptor and adapted to limit a heat flow from the susceptor, wherein at least a part of the heat-insulating portion is made of the aluminum nitride-based sintered body as set fort in claim 5.

13. A semiconductor-holding apparatus comprising a susceptor having a corrosion-resistive face to be exposed to a halogen-based gas plasma and a rear face, a supporter provided at the rear face of the susceptor and adapted to support the susceptor form a side of the rear face, and at least a part of the support member is made of the aluminum nitride-based sintered body set forth in claim 5.

* * * * *